United States Patent
Chen et al.

(10) Patent No.: US 9,698,218 B2
(45) Date of Patent: Jul. 4, 2017

(54) METHOD FOR FORMING SEMICONDUCTOR STRUCTURE

(71) Applicant: UNITED MICROELECTRONICS CORP., Hsin-Chu (TW)

(72) Inventors: Hsin-Yu Chen, Nantou County (TW); Sheng-Hao Lin, Hsinchu County (TW); Huai-Tzu Chiang, Tainan (TW); Hao-Ming Lee, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/221,617

(22) Filed: Jul. 28, 2016

(65) Prior Publication Data
US 2016/0336401 A1 Nov. 17, 2016

Related U.S. Application Data

(62) Division of application No. 14/614,392, filed on Feb. 4, 2015, now Pat. No. 9,431,482.

(51) Int. Cl.
| | |
|---|---|
| H01L 29/06 | (2006.01) |
| H01L 21/02 | (2006.01) |
| B82Y 30/00 | (2011.01) |
| B82Y 40/00 | (2011.01) |
| H01L 21/324 | (2006.01) |
| H01L 21/306 | (2006.01) |
| H01L 29/10 | (2006.01) |

(52) U.S. Cl.
CPC ......... *H01L 29/0673* (2013.01); *B82Y 30/00* (2013.01); *B82Y 40/00* (2013.01); *H01L 21/0217* (2013.01); *H01L 21/0262* (2013.01); *H01L 21/02164* (2013.01); *H01L 21/02488* (2013.01); *H01L 21/02532* (2013.01); *H01L 21/02603* (2013.01); *H01L 21/02636* (2013.01); *H01L 21/02639* (2013.01); *H01L 21/02664* (2013.01); *H01L 21/30604* (2013.01); *H01L 21/3247* (2013.01); *H01L 29/0669* (2013.01); *H01L 29/1033* (2013.01)

(58) Field of Classification Search
CPC .......... H01L 29/0673; H01L 21/02603; H01L 21/02606; H01L 21/3247; H01L 29/0665; H01L 29/0669; B82Y 40/00; B82Y 30/00
See application file for complete search history.

(56) References Cited

U.S. PATENT DOCUMENTS

| | | | |
|---|---|---|---|
| 8,420,455 B2 | 4/2013 | Bangsaruntip | |
| 2011/0278543 A1 | 11/2011 | Bangsaruntip | |
| 2011/0278544 A1* | 11/2011 | Bangsaruntip | B82Y 10/00 257/24 |
| 2014/0097502 A1 | 4/2014 | Sun | |
| 2014/0210013 A1 | 7/2014 | Kim | |

* cited by examiner

*Primary Examiner* — Thanhha Pham
(74) *Attorney, Agent, or Firm* — Winston Hsu

(57) ABSTRACT

The present invention provides some methods for forming at least two different nanowire structures with different diameters on one substrate. Since the diameter of the nanowire structure will influence the threshold voltage (Vt) and the drive currents of a nanowire field effect transistor, in this invention, at least two nanowire structures with different diameters can be formed on one substrate. Therefore, in the following steps, these nanowire structures can be applied in different nanowire field effect transistors with different Vt and drive currents. This way, the flexibility of the nanowire field effect transistors can be improved.

9 Claims, 6 Drawing Sheets

METHOD FOR FORMING SEMICONDUCTOR STRUCTURE

CROSS REFERENCE TO RELATED APPLICATIONS

This application is a divisional application of U.S. patent application Ser. No. 14/614,392 filed Feb. 4, 2015, which is herein incorporated by reference in its entirety.

BACKGROUND OF THE INVENTION

1. Field of the Invention

The invention relates to methods for fabricating semiconductor structure, in particular, methods for forming at least two different nanowire structures with different diameters on one substrate.

2. Description of the Prior Art

The fabrication of a nanowire field effect transistor (FET) with a gate dielectric and a gate conductor surrounding the nanowire channel (also known as a gate-all-around nanowire FET) includes suspension of the nanowires. Suspension of the nanowires allows for the gate conductor to cover all surfaces of the nanowires.

The fabrication of a gate-all-around nanowire FET typically includes the following steps: (1) Definition of the nanowires between source and drain regions by patterning a silicon-on-insulator (SOI) layer. (2) Suspension of the nanowires by isotropic etching that undercuts the insulator on which the nanowires are resting. This etching step also undercuts the insulator at the edge of the source and drain region. The overhang/undercut that forms may not be a desirable outcome. (3) A blanket and conformal deposition of the gate dielectric and the gate conductor. The gate dielectric and the gate conductor wraps around the suspended nanowires and fills the undercut at the edge of the source and drain regions. (4) Definition of the gate line which includes the etching of the gate line and removal of the gate dielectric and the gate conductor material from all regions outside the gate line, including gate material deposited in the cavities at the edge of the source and drain regions.

SUMMARY OF THE INVENTION

The present invention provides a method for forming a semiconductor structure, at least comprising the following steps: first, a substrate is provided, a first region and a second region are defined on the substrate, and at least one material layer is formed on the substrate, next, a height adjusting process is performed on the material layer within the second region, so as to make the height of the material layer within the second region differ from the height of the material layer within the first region, afterwards, a patterning process is performed, to remove parts of the material layer, and so as to form at least one first channel structure within the first region and at least one second channel structure within the second region, and an anneal process is performed, to transform each first channel structure into a first nanowire structure, and to transform each second channel structure into a second nanowire structure, wherein the diameter of the first nanowire structure is different from the diameter of the second nanowire structure.

The present invention also provides a method for forming a semiconductor structure, at least comprising the following steps: first, a substrate is provided, a first region and a second region are defined on the substrate, at least one first channel structure is formed within the first region, at least one second channel structure is formed within the second region, next, a cap layer is covered on the second channel structure within the second region, a first anneal process is then performed to transform each first channel structure to a first nanowire structure, the cap layer is then removed, and a second anneal process is then performed to transform each second channel structure to a second nanowire structure, wherein the diameter of the first nanowire structure is different from the diameter of the second nanowire structure.

Those embodiments mentioned above provide some methods for forming at least two different nanowire structures with different diameters on one substrate. Since the diameter of the nanowire structure will influence the threshold voltage (Vt) and the drive currents of a nanowire field effect transistor, in this invention, at least two nanowire structures with different diameters can be formed on one substrate. Therefore, in the following steps, these nanowire structures can be applied indifferent nanowire field effect transistors with different Vt and drive currents. This way, the flexibility of the nanowire field effect transistors can be improved.

These and other objectives of the present invention will no doubt become obvious to those of ordinary skill in the art after reading the following detailed description of the preferred embodiment that is illustrated in the various figures and drawings.

DETAILED DESCRIPTION

In accordance with aspects of the present invention, nominal, high and low threshold voltage (Vt) masks are employed to modulate a thickness of initial silicon on insulator (SOI) structure thickness.

Structures to support, for example, gate-all-around (GAA) nanowire field effect transistors (FETs) as well as methods for fabricating the same are provided by way of descriptions referring to silicon (Si) nanowires and Si processing. However, the present techniques can also be practiced with other semiconductor materials such as, for example, germanium (Ge). When non-Si-containing semiconductors are used, the processing steps of the present teachings are similar and adapted to the specific semiconductor used. Use of Si-containing semiconductor materials such as Si, silicon germanium (SiGe), Si/SiGe, silicon carbide (SiC) or silicon germanium carbide (SiGeC) are therefore understood to be merely exemplary.

Figure 1:
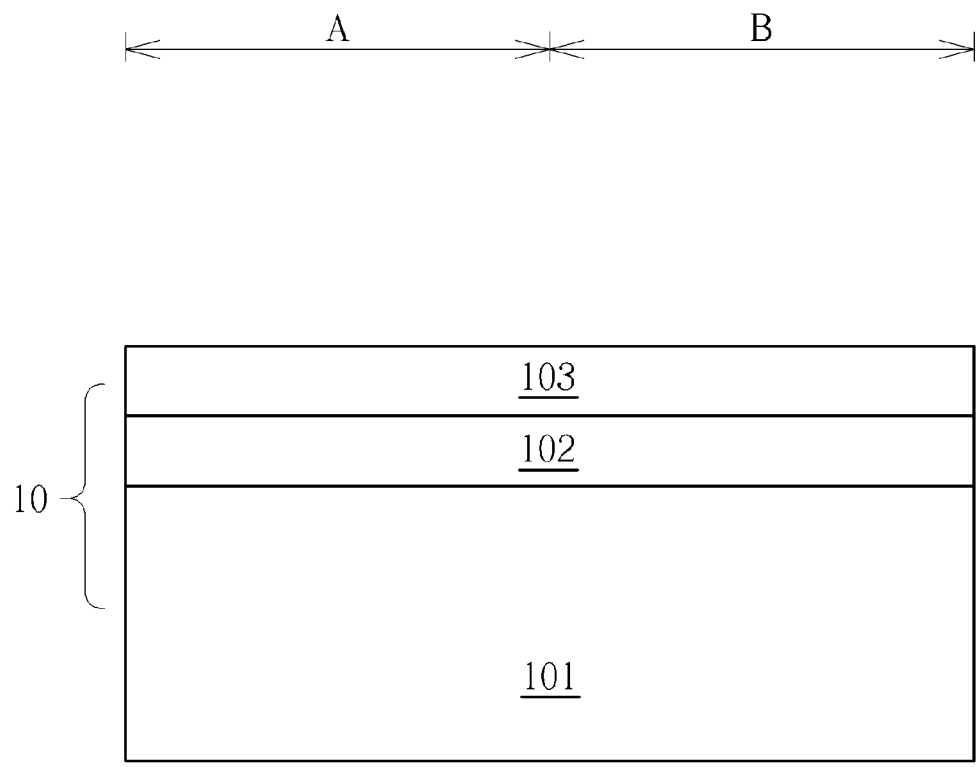
FIG. 1 is a cross-section view of the semiconductor structure of the first preferred embodiment of the present invention.

Please refer to FIG. 1. FIG. 1 is a cross-section view of the wafer having nanowire channels defined thereon at first and second regions. As shown in FIG. 1. A substrate 10 is provided, in this embodiment, the substrate 10 is a multiple layer structure, such as a silicon-on-insulator (SOI) substrate, including a Si substrate 101, a buried oxide (BOX) layer 102 and a material layer 103, wherein the material layer 103 preferably includes a single layer, such as a silicon layer, a germanium layer or a silicon germanium layer. The substrate 10 can be fabricated using methods that are known to those of skill in the art and thus are not described further herein. Besides, in another embodiment of the present invention, the substrate 10 can also be a single layer structure, such as a silicon substrate, it should be within the scope of the present invention.

In addition, please still refer to FIG. 1, a first region A and a second region B are defined on the substrate 10. In the following steps of the present invention, at least one first nanowire structure will be formed within the first region A, and at least one second nanowire structure will be formed within the second region, wherein the diameter of the first nanowire structure is different from the diameter of the second nanowire structure. Other details about the first nanowire structure and the second nanowire structure will be described in the following paragraphs.

Figure 2:
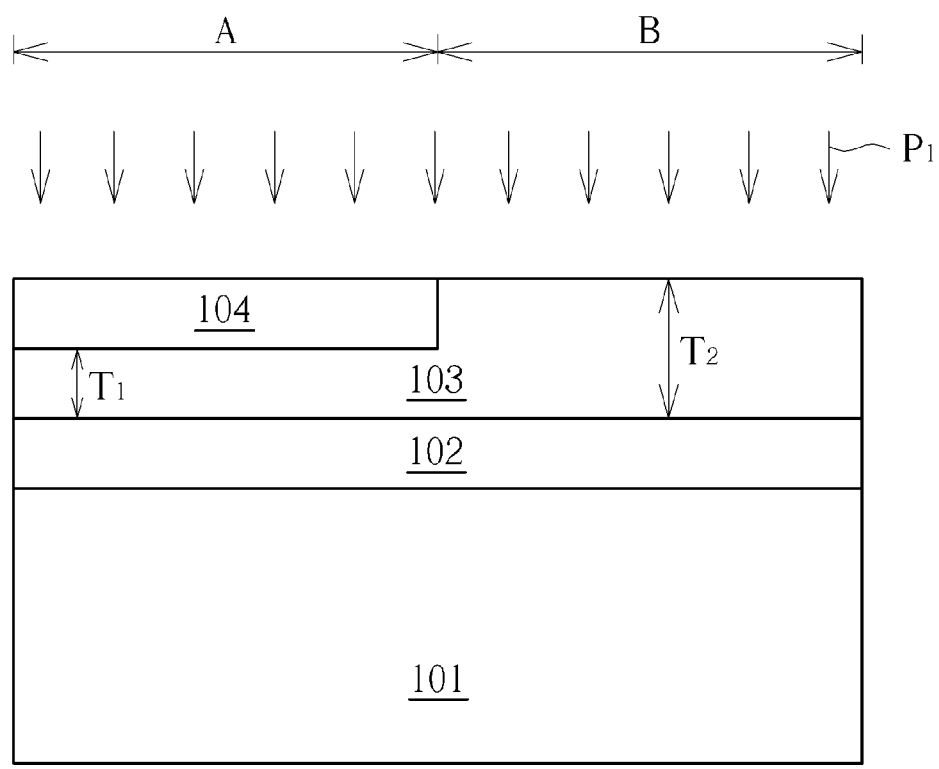
FIG. 2 is a cross-section view of the semiconductor structure of the first preferred embodiment of the present invention.

Next, please refer to FIG. 2. A hard mask 104 is formed to cover the material layer 103 only within the first region A. The hard mask 104 may consist of materials such as $SiO_2$, or $Si_3N_4$, but not limited thereto. And a height adjusting process P1 is then performed on the material layer 103 within the second region B, so as to change the thickness (height) of the material layer 103 within the second region B, where the height mentioned here means the vertical distance from the top surface of the BOX layer 102 to the top surface of the material layer 103. The height adjusting process P1 may comprise an etching process or a deposition process. If the height adjusting process P1 is an etching process, such as dry etching processes and/or wet etching processes, after the height adjusting process P1 is performed, the thickness (height) $T_2$ of the material layer 103 within the second region B will be decreased, and lower than the thickness (height) $T_1$ of the material layer 103 within the first region A. On the other hand, if the height adjusting process is a deposition process, such as epitaxial growth process, a chemical vapor deposition (CVD) or an atomic layer deposition (ALD), after the height adjusting process P1 is performed, the thickness (height) $T_1$ of the material layer 103 within the second region B will be increased, and higher than the thickness (height) $T_1$ of the material layer 103 within the first region A. In this embodiment of the present invention, the height adjusting process P1 is a deposition process, but not limited thereto. After the height adjusting process P1 is performed, the hard mask 104 is then removed, such as through an etching process, but not limited thereto.

Figure 3:
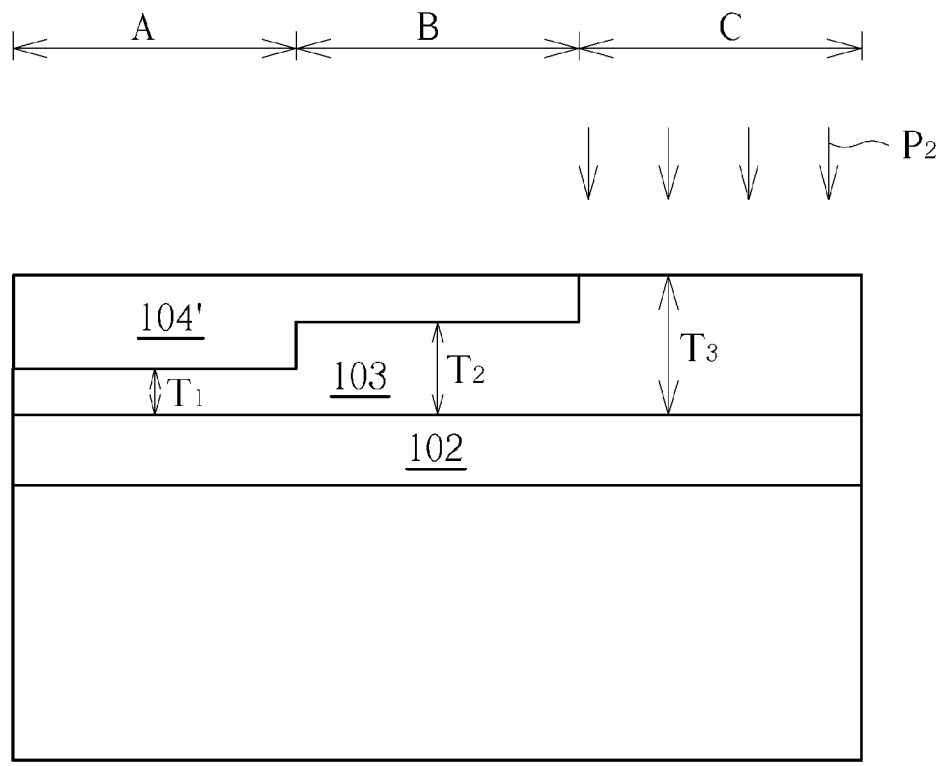
FIG. 3 is a cross-section view of the semiconductor structure of another preferred embodiment of the present invention.

In this embodiment, after the height adjusting process P1 is performed, the height of the material layer 103 will be changed in different regions. In other words, in the embodiment mentioned above, the material layer 103 within the first region A or within the second region B has different height (thickness). However, in another embodiment of the present invention, it may further comprise a third region C defined on the substrate. As shown in FIG. 3, after the hard mask 104 is removed, another hard mask 104' is then covered on the material layer 103 within the first region A and the second region B, or in another embodiment, the hard mask 104' can be formed on the hard mask 104 directly, without removing the hard mask 104. Afterwards, another height adjusting process P2 is then performed on the material layer 103 within the third region C. Similar to the height adjusting process P1, the height adjusting process P2 may comprise an etching process or a deposition process. And after the height adjusting process P2 is performed, the height $T_3$ of the material layer 103 within the third region C will differ from the height of the material layer 103 within the first region A or within the second region B. Furthermore, besides the first region to the third region mentioned above, more regions can also be defined on the substrate 10, and the height adjusting processes is then performed on the material layer within these regions, so as to change the height of the material layer. To simplify the description, the following paragraphs still take the structure shown in FIG. 2 as an example, but it should be understood that the substrate can also include more than two regions defined thereon, and the material layer disposed within each region has different heights. Besides, if the height adjusting process P1 or the height adjusting process P2 is a deposition processes, material which is different from the material layer 103 can also be deposited during the deposition process, such as a germanium layer, so as to change the Ge concentration of the material layer 103. It should also be within the scope of the present invention.

Figure 4:
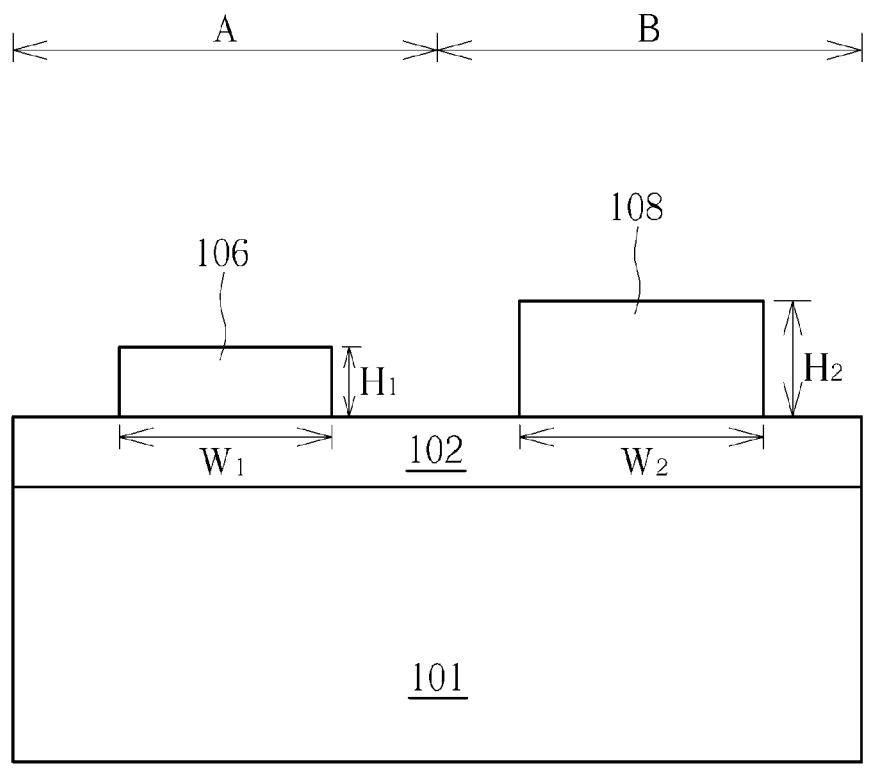
FIG. 4 is a cross-section view of the semiconductor structure of the first preferred embodiment of the present invention.

Next, as shown in FIG. 4, a patterning process is then performed, so as to remove parts of the material layer 103, and after the patterning process is performed, at least one first channel structure 106 within the first region A and at least one second channel structure 108 within the second region B are respectively formed, wherein the first channel structure 106 has a first thickness (height) $T_1$, and the second channel structure 108 has a second thickness (height) $T_2$, the thickness $T_1$ is different from the height $T_2$. In the present invention, the first channel structure 106 or the second channel structure 108 are preferably strip-shaped or fin shaped structures, and they will be transformed into the nanowire structures though an anneal process in the following steps. Afterwards, the gate structure will cross over the nanowire structures, so as to form the nanowire field effect transistor device, it will be described in the following paragraphs. In this embodiment, the patterning process may be achieved by lithography (e.g. optical or e-beam) followed by reactive ion etching (RIE), double patterning, sidewall image transfer (SIT) or by dual SIT, but not limited thereto. Besides, if there are more than two regions defined on the substrate 10 (such as further comprising the third region C shown as FIG. 3), after the patterning process is performed, at least one third channel structure will be formed within the third region C, wherein the third channel structure has different height from the first channel structure 106 or the second channel structure 108. Besides, in this embodiment, a width W1 of the first channel structure 106 is the same as a width W2 of second channel structure 108, but not limited thereto. The widths of the first channel structure 106 or the second channel structure 108 can be adjusted according to actual requirements.

Figure 4A:
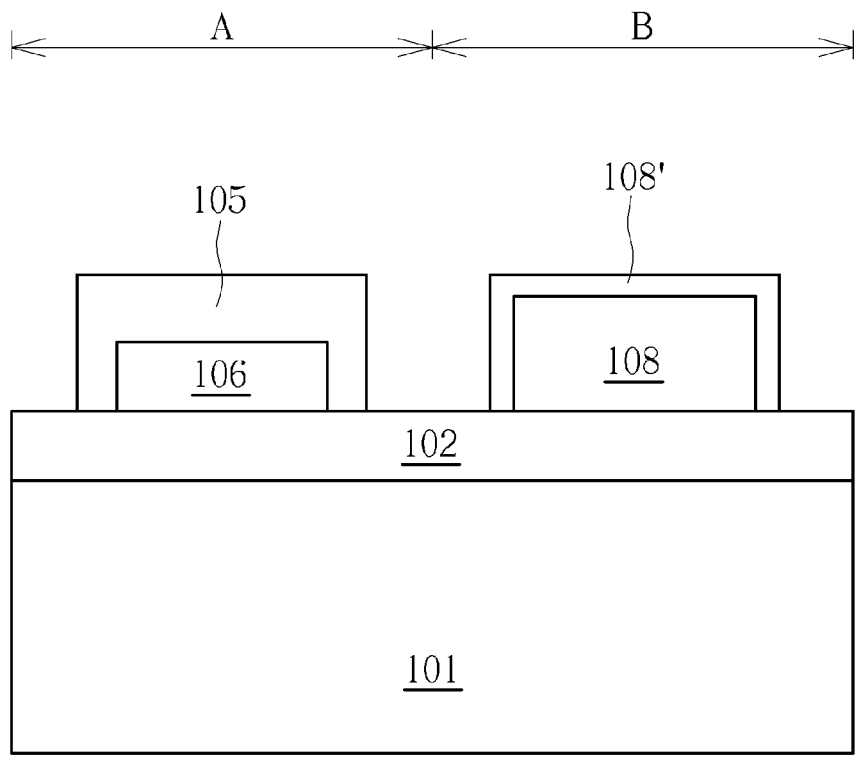
FIG. 4A is a cross-section view of the semiconductor structure of another preferred embodiment of the present invention.

In addition, in another embodiment of the present invention, please refer to FIG. 4A, which illustrates the semiconductor structure of another preferred embodiment of the present invention. After the first channel structure 106 and the second channel structure 108 with different heights are formed, the exposed surface of substrate 10 can be selectively cleaned. Next, a hard mask 105 can be formed, covering the first channel structure 106 or the second channel structure 108. In this embodiment, the hard mask 105 covers the first channel structure 106 and exposes the second channel structure 108, but not limited thereto. Afterwards, a silicon epitaxy or an etching process is applied to the surface of the substrate 10. In an epitaxial process, silicon is added to the exposed second channel structure 108, so as to change the height or the width of second channel structure 108, and a silicon epitaxy layer 108' is formed on the second channel structure 108.

In accordance with embodiments, the epitaxial growth described above is selective. To obtain selective silicon growth, chlorine-containing Si precursors such as silicon-tetrachloride ($SiCl_4$) and dichlorosilane ($H_2SiCl_2$,) are frequently used. A mixture of silane ($SiH_4$) and HCl can also be used. The growth temperature depends on the precursor used. For example, a low temperature selective epitaxial growth (SEG) can be used, or when $SiH_4$ is used, a growth temperature higher than 500° C. is required.

Figure 5:
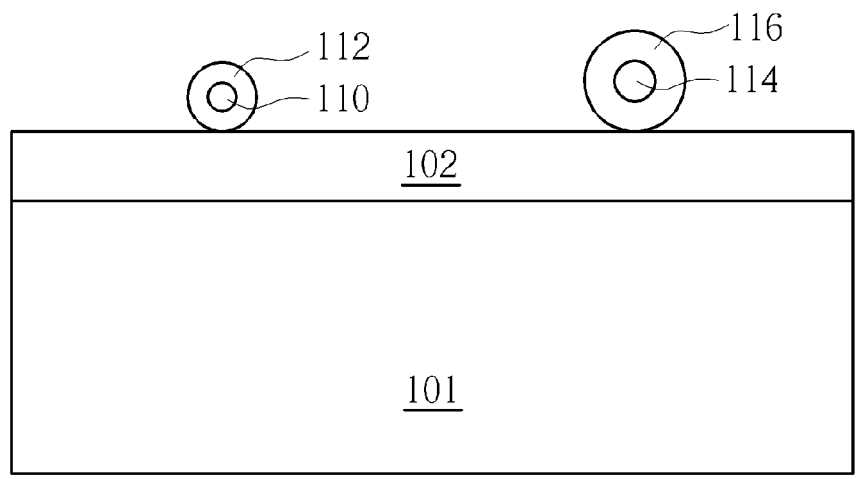
FIG. 5 is a cross-section view of the semiconductor structure of the first preferred embodiment of the present invention.

Finally, as shown in FIG. 5, after the hard mask 105 is removed, an anneal process P3 is performed, so as to transform the first channel structure 106 into a first nanowire structure 110, and to transform the second channel structure 108 into a second nanowire structure 114, wherein the diameter of the first nanowire structure 110 is different from the diameter of the second nanowire structure 114. More precisely, the first channel structure 106 and the second channel structure 108 may be annealed in an exemplary $H_2$ and/or $O_2$ gas. The annealing in $H_2/O_2$ smoothes the nanowire corners, and realigns the sidewalls of the nanowire cross-sections from rectangular to cylindrical. The $H_2/O_2$ anneal process P3 may also thin the bodies of the first channel structure 106/second channel structure 108 by the Si migration. It is noteworthy that if the anneal process P3 is performed with oxygen, an oxide layer 112 and an oxide layer 116 will be formed surrounded the first nanowire structure 110 and the second nanowire structure 114 respectively. But if the anneal process P3 is not performed with oxygen (such as only the hydrogen is added in the chamber during the anneal process P3), the oxide layer 112 and the oxide layer 116 mentioned above will not be formed, it should also be within the scope of the present invention. Besides, if there are more than two regions defined on the substrate 10 (such as further comprising the third region C shown as FIG. 3), after the anneal process P3 is performed, at least one third nanowire structure will be formed within the third region C, wherein the third nanowire structure has a different diameter from the first nanowire structure 110 or the second nanowire structure 114.

According to an exemplary embodiment, the inert gas anneal may be performed with a gas pressure of from about 30 torr to about 1000 torr, at a temperature of from about 600 degrees Celsius (° C.) to about 1100° C., and for a duration of about 1-120 minutes. In general, the rate of Si redistribution increases with temperature and decreases with an increase in pressure.

Figure 5A:
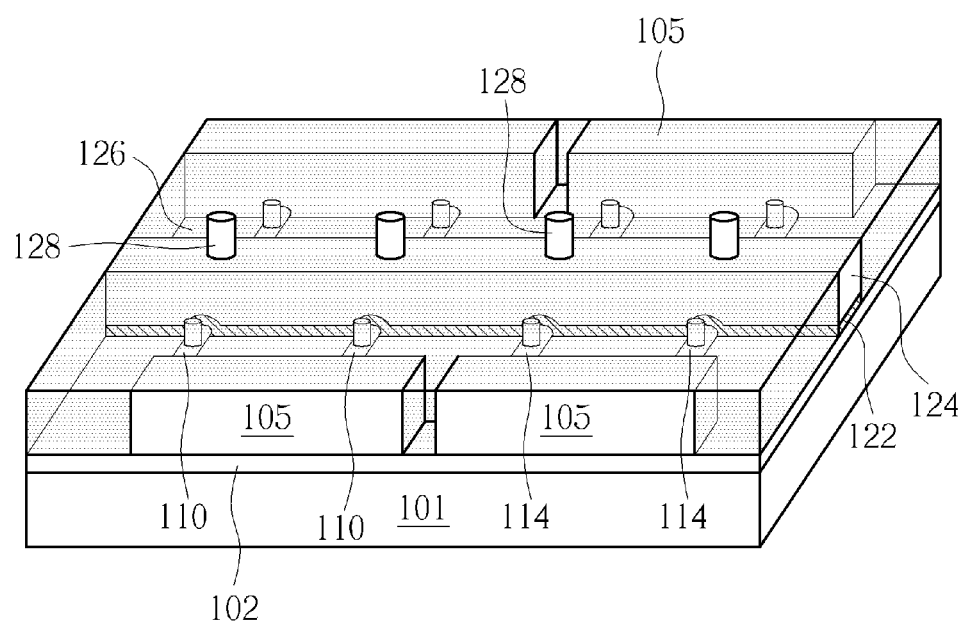
FIG. 5A is a 3D diagram showing a nanowire field effect transistor device of the present invention.

After the first nanowire structure 110 and the second nanowire structure 114 are formed, it may be applied in a nanowire field effect transistor device. For example, please refer to FIG. 5A, which shows a 3D diagram of a nanowire field effect transistor device of the present invention. As shown in FIG. 5A, the oxide layer 112 and the oxide layer 116 are removed, and a plurality of first nanowire structures 110 and a plurality of second nanowire structures 114 are disposed on the buried oxide layer 102. It is noteworthy that further comprising a plurality of supporting structures 105 on the buried oxide layer 102, and the first nanowire structures 110 or the second nanowire structures 114 are disposed between two supporting structures 105, the supporting structure 105 helps to make the first nanowire structures 110 or the second nanowire structures 114 suspended and do not contact the buried oxide layer 102 directly, Afterwards, other processes, such as forming a gate dielectric layer 122 and a gate structures 124 surrounding the nanowire structures, forming a dielectric layer 126 to cover the nanowire structures, or forming the contact structures 128, can be performed in the following steps, so as to complete a nanowire field effect transistor device. These processes mentioned above are known to those of skill in the art.

Figure 6:
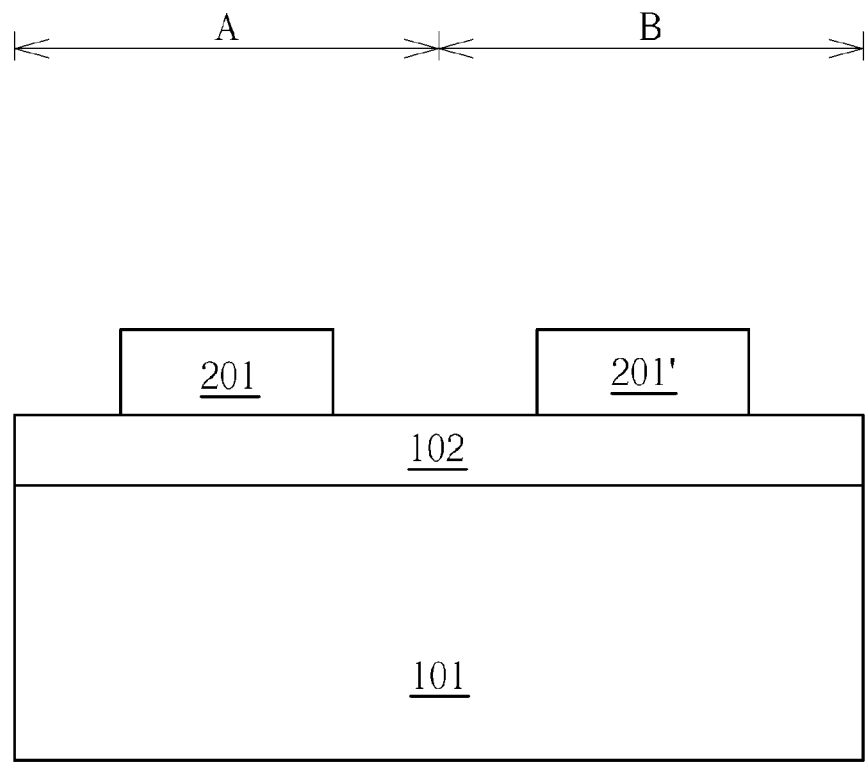
FIG. 6 is a cross-section view of the semiconductor structure of the second preferred embodiment of the present invention.

Please refer to FIGS. 6-9. FIGS. 6-9 show the second preferred embodiment of the method for forming the nanowires structures of the present invention. As shown in FIG. 6, a substrate 101, a buried oxide (BOX) layer 102 and a material layer (not shown) are provided. Next, a patterning process is performed, so as to remove parts of the material layer to form at least two channel structures on the substrate. In this embodiment, the substrate 101, the buried oxide (BOX) layer 102 and the material layer are similar to those elements mentioned in the first preferred embodiment, and the patterning process such as a lithography process. In addition, after the patterning process is performed, one channel structure 201 is disposed within a first region A, and another channel structure 201' is disposed within a second region B, and these two channel structures have the same height. In this embodiment, the channel structure 201 and the channel structure 201' have the same width and same height, but not limited thereto. The height or the width of the channel structure 201 and the height or the width of the channel structure 201' may be different (such as the structure shown in FIG. 4).

Figure 7:
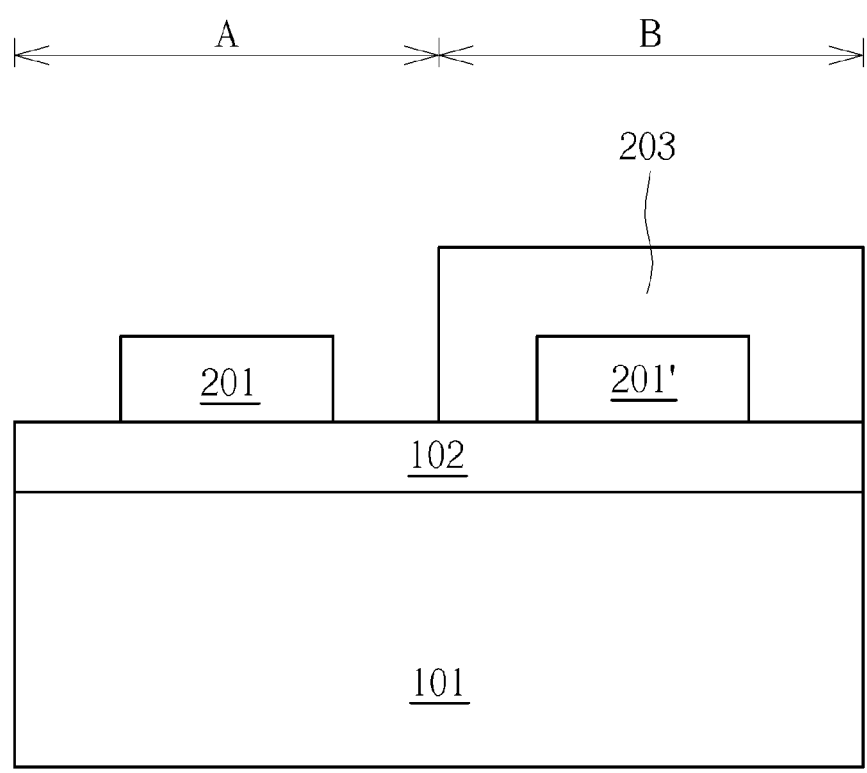
FIG. 7 is a cross-section view of the semiconductor structure of the second preferred embodiment of the present invention.
Figure 8:
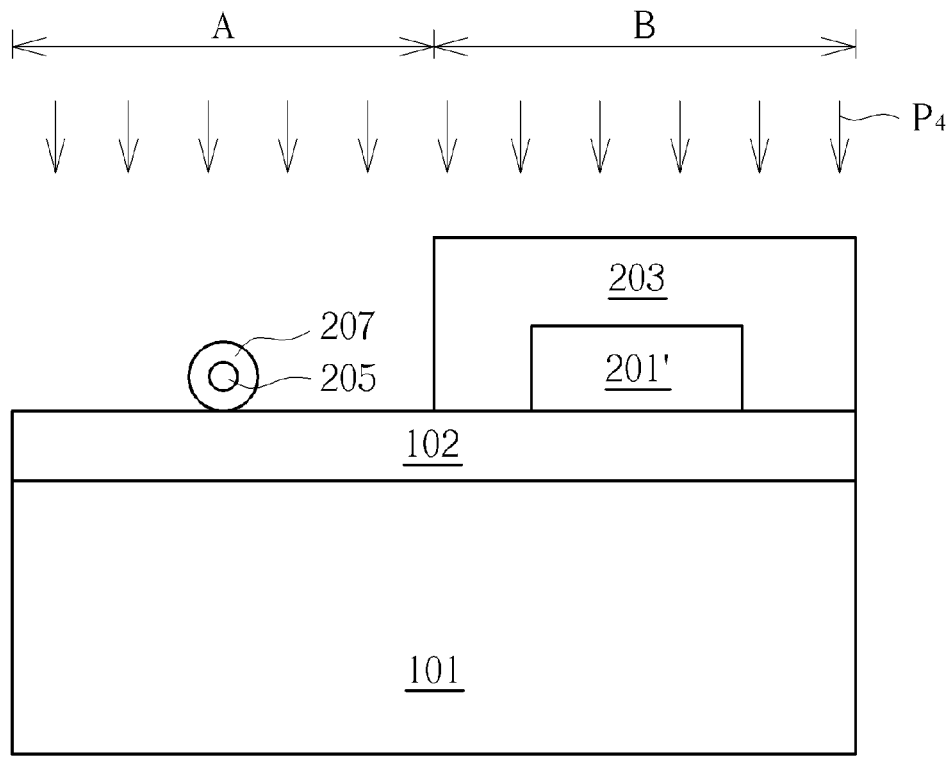
FIG. 8 is a cross-section view of the semiconductor structure of the second preferred embodiment of the present invention.

Next, as shown in FIGS. 7-8, a hard mask 203 is formed to cover the second region B, especially covering on the channel structure 201'. The hard mask may comprise silicon oxide or silicon nitride, but not limited thereto. Afterwards, as shown in FIG. 8, an anneal process P4 is then performed, to transform the channel structure 201 into a first nanowire structure 205. The anneal process P4 is similar to the anneal process P3 mentioned in the first preferred embodiment. If oxygen gas is present during the anneal process P4, an oxide layer 207 will be formed and surrounding the first nanowire structure 205, but not limited thereto. If the anneal process P4 does not comprise oxygen gas, the oxide layer 207 will not be formed.

Figure 9:
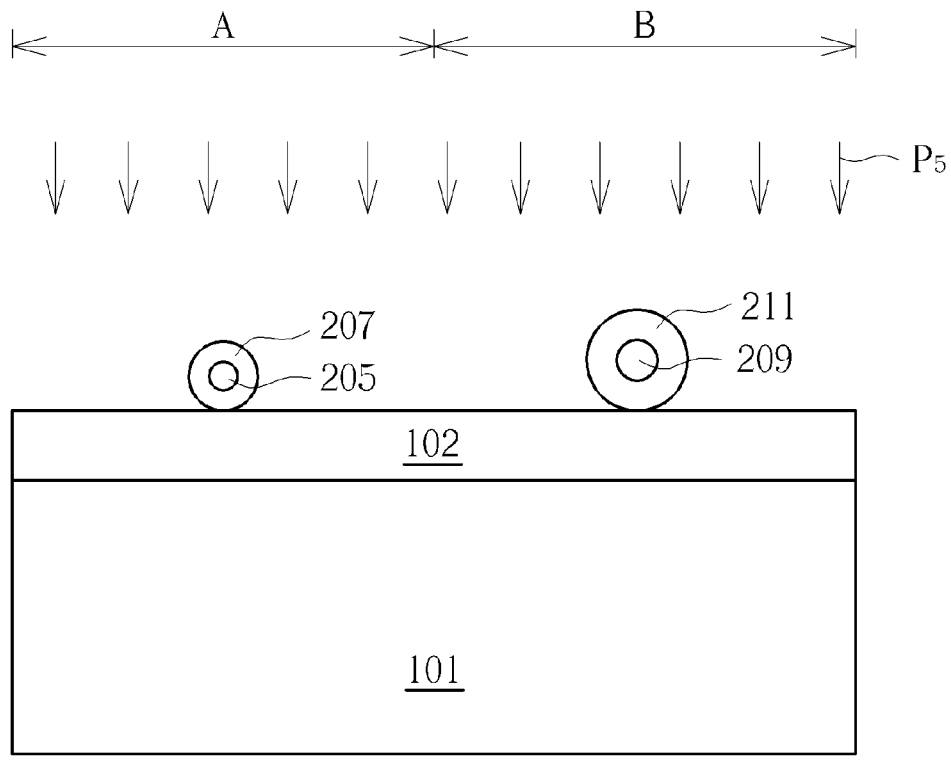
FIG. 9 is a cross-section view of the semiconductor structure of the second preferred embodiment of the present invention.

Finally, as shown in FIG. 9, after the hard mask 203 is removed, the channel structure 201' disposed within the second region B is exposed, and another anneal process P5 is then performed, so as to transform the channel structure 201' into a second nanowire structure 209, and an oxide layer 211 will be selectively formed and surrounding the second nanowire structure 209. The anneal process P5 is similar to the anneal process P4 mentioned above. It mainly comprises a heating process with specific gases (such as oxygen or hydrogen), but it should be noted that the parameters can be adjusted according to actual requirements. Furthermore, it is noteworthy that when the anneal process P5 is performed, the first nanowire structure 205 and the oxide layer 207 may be re-shaped or be etched too, generally, the diameter or thickness of the first nanowire structure 205 and the oxide layer 207 will be decreased after the anneal process P5 is performed, but not limited thereto. In this embodiment, since the channel structure 201 and channel structure 201' are annealed in different steps, the nanowire structures with different diameters can be formed on one substrate. Besides, in another embodiment, after the hard mask 203 is removed and before the anneal process P5 is performed, another hard mask (not shown) can be formed to cover the first nanowire structure 205. Therefore, the anneal process P5 will only be performed on the channel structure 201', but not on the channel structure 201. It should be within the scope of the present invention.

Those embodiments mentioned above provide some methods for forming at least two different nanowire structures with different diameters on one substrate. Since the diameter of the nanowire structure will influence the threshold voltage (Vt) and the drive currents of a nanowire field effect transistor, in this invention, at least two nanowire structures with different diameters can be formed on one substrate. Therefore, in the following steps, these nanowire structures can be applied indifferent nanowire field effect transistors with different Vt and drive currents. This way, the flexibility of the nanowire field effect transistors can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, at least comprising the following steps:
    providing a substrate, a first region and a second region being defined on the substrate, at least one first channel structure being formed within the first region, and at least one second channel structure being formed within the second region, wherein the first channel structure and the second first channel structure have same width and same height;
    covering a cap layer on the second channel structure within the second region;
    performing a first anneal process to transform each first channel structure to a first nanowire structure;
    removing the cap layer; and
    performing a second anneal process to transform each second channel structure to a second nanowire structure, wherein the diameter of the first nanowire structure is different from the diameter of the second nanowire structure.

2. The method of claim 1, wherein the cap layer is removed after the first anneal process is performed.

3. The method of claim 1, wherein the diameter of the second nanowire structure is larger than the diameter of the first nanowire structure.

4. The method of claim 1, wherein the first anneal process and the second anneal process comprise an anneal process with oxygen or an anneal process without oxygen.

5. The method of claim 4, wherein the anneal process without oxygen comprises an anneal process with hydrogen.

6. The method of claim 1, wherein the first nanowire structure and the second nanowire structure comprise silicon or silicon germanium.

7. The method of claim 1, wherein the cap layer comprises silicon oxide or silicon nitride.

8. The method of claim 1, wherein a height of the first channel structure and the height of the second channel structure are different.

9. The method of claim 1, wherein a width of the first channel structure and the width of the second channel structure are different.

* * * * *